United States Patent [19]

Hill

[11] 4,119,960
[45] Oct. 10, 1978

[54] METHOD AND APPARATUS FOR SAMPLING AND HOLDING AN ANALOG INPUT VOLTAGE WHICH ELIMINATES OFFSET VOLTAGE ERROR

[75] Inventor: Lorimer K. Hill, Cupertino, Calif.

[73] Assignee: Siliconix Incorporated, Santa Clara, Calif.

[21] Appl. No.: 767,735

[22] Filed: Feb. 11, 1977

[51] Int. Cl.² ........................................... H03K 13/09
[52] U.S. Cl. ..................... 340/347 AD; 340/347 SH; 328/151
[58] Field of Search .................. 340/347 SH, 347 CC, 340/347 AD; 328/151

[56] References Cited
U.S. PATENT DOCUMENTS

| 3,588,881 | 6/1971 | Gordon | 340/347 AD |
| 3,982,241 | 9/1976 | Lipcon | 340/347 SH |

Primary Examiner—Charles D. Miller
Attorney, Agent, or Firm—Flehr, Hohbach, Test, Albritton & Herbert

[57] ABSTRACT

A sample and hold circuit uses two amplifiers the second being a Miller integrator and the first a comparator which compares the feed back stored capacitor voltage to the sampled voltage to bring the stored voltage of the capacitor to the sample voltage value. This stored voltage will have included in it the offset voltage of the first amplifier. However on readout this offset voltage is eliminated by disconnecting the sample input and also the connection between the output of the first amplifier and the input of the second and instead connecting the output of the first amplifier to the sample input and taking the output from this interconnection line. Since the noninverting or plus terminal of the first amplifier has impressed upon it the stored voltage of the capacitor the unwanted offset voltage is effectively subtracted. The foregoing sample and hold circuit also finds preferred use in a 12 bit recirculating A to D converter where cumulative offset errors would cause error. In such a configuration one of the sample and hold circuits can have the feedback interconnection of the first amplifier configured to perform suitable multiplication and subtraction, for example, for a Gray code. Here a second sample and hold circuit stores successive computational results.

8 Claims, 8 Drawing Figures

RECIRCULATING GRAY CODE A/D CONVERTER

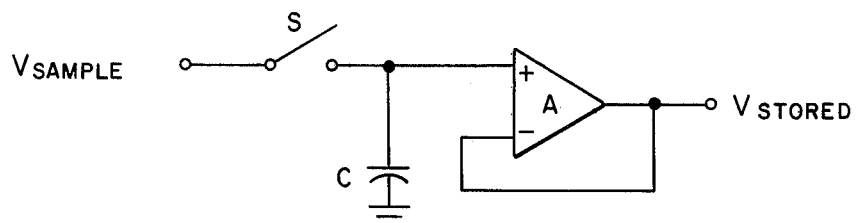
$V_{STORED} = V_{SAMPLE} + V_{OFFSET}$
FIG.—1A    PRIOR ART
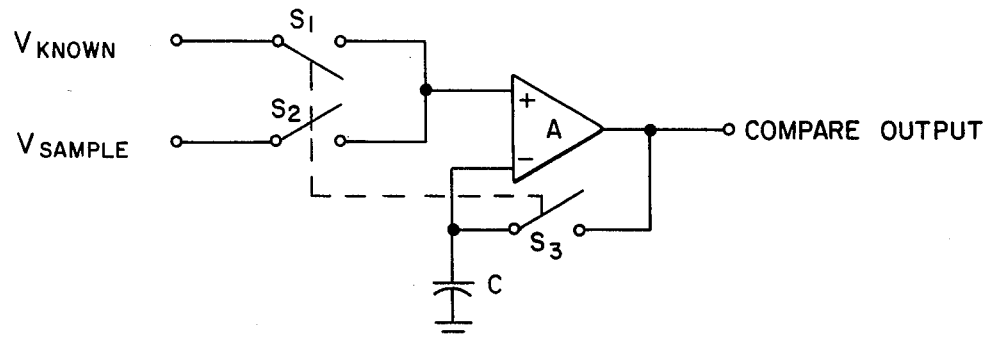
FIG.—1B    PRIOR ART
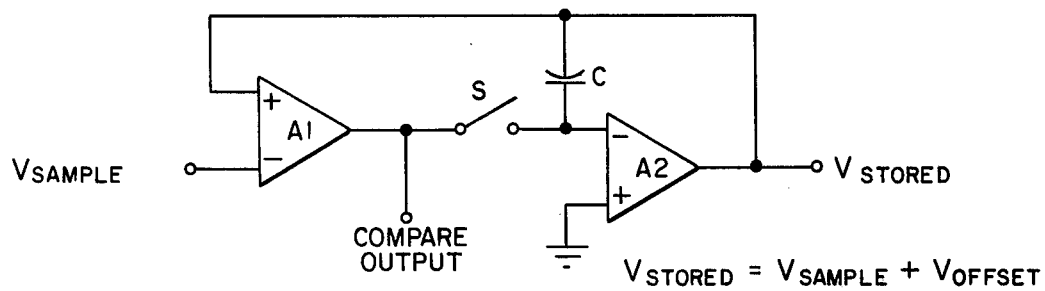
$V_{STORED} = V_{SAMPLE} + V_{OFFSET}$
FIG.—1C    PRIOR ART
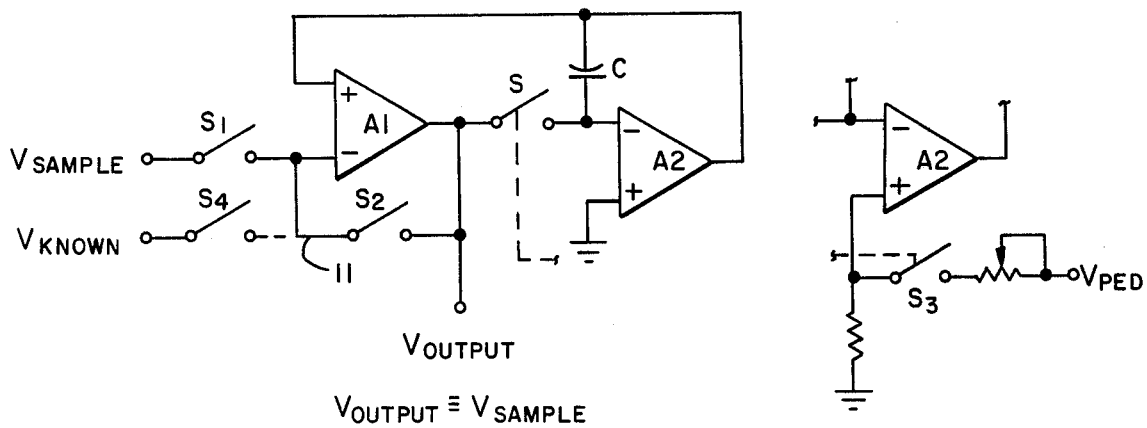
$V_{OUTPUT} \equiv V_{SAMPLE}$
FIG.—2    FIG.—2A

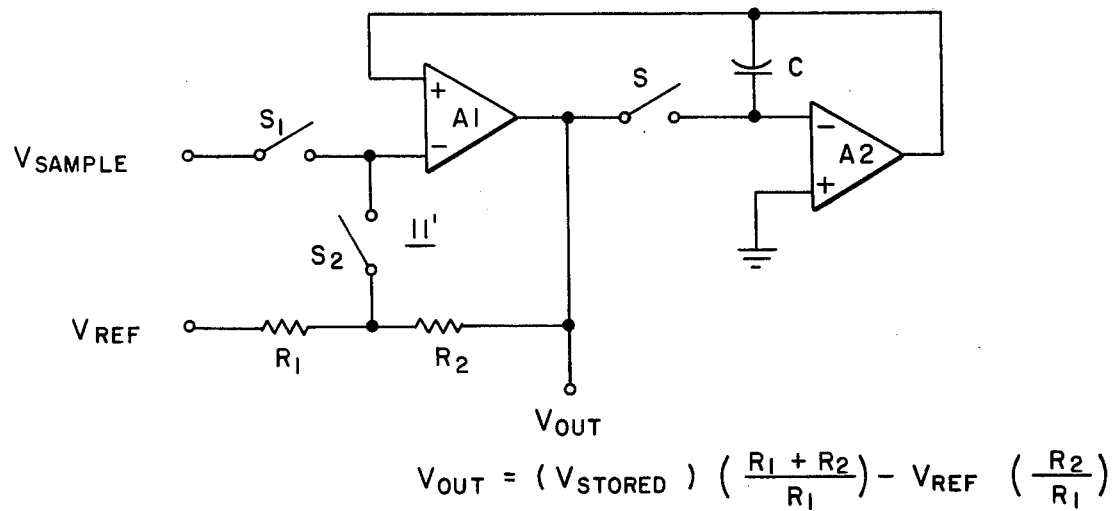
$$V_{OUT} = (V_{STORED})\left(\frac{R_1 + R_2}{R_1}\right) - V_{REF}\left(\frac{R_2}{R_1}\right)$$
IF  $R_1 = R_2$   $V_i + 1 = V_R - 2V_i$
FIG.—3
| STATE | FUNCTION | SWITCH CLOSURES 1 2 3 4 5 6 7 8 9 | STROBE |
|---|---|---|---|
| 1 | STORE $V_{IN}$ | X X         X X | |
| 2 | BIT 1 (SIGN) |    X       X X | ⎍ |
| 3 | $\pm V_R \mp 2V_{IN}$ |      +X- X X | |
| 4 | STORE $\pm V_R \mp 2V_{IN}$ | X        X X | |
| 2 | BIT 2 (MSB) |    X       X X | ⎍ |
| 3 | $\pm V_R \mp 2V_2$ |      +X- X X | |
| 4 | STORE $\pm V_R \mp 2V_2$ | X        X X | |
| 2 | BIT 3 (MSB−1) |    X       X X | ⎍ |
| 3 | | | |
| 4 | | | |
| 2 | BIT 11 (LSB+1) |    X       X X | ⎍ |
| 3 | | | |
| 4 | | | |
| 2 | BIT 12 (LSB) |    X       X X | ⎍ |
| 1 | STORE $V_{IN}$ | X X       X X | |
FIG.—5

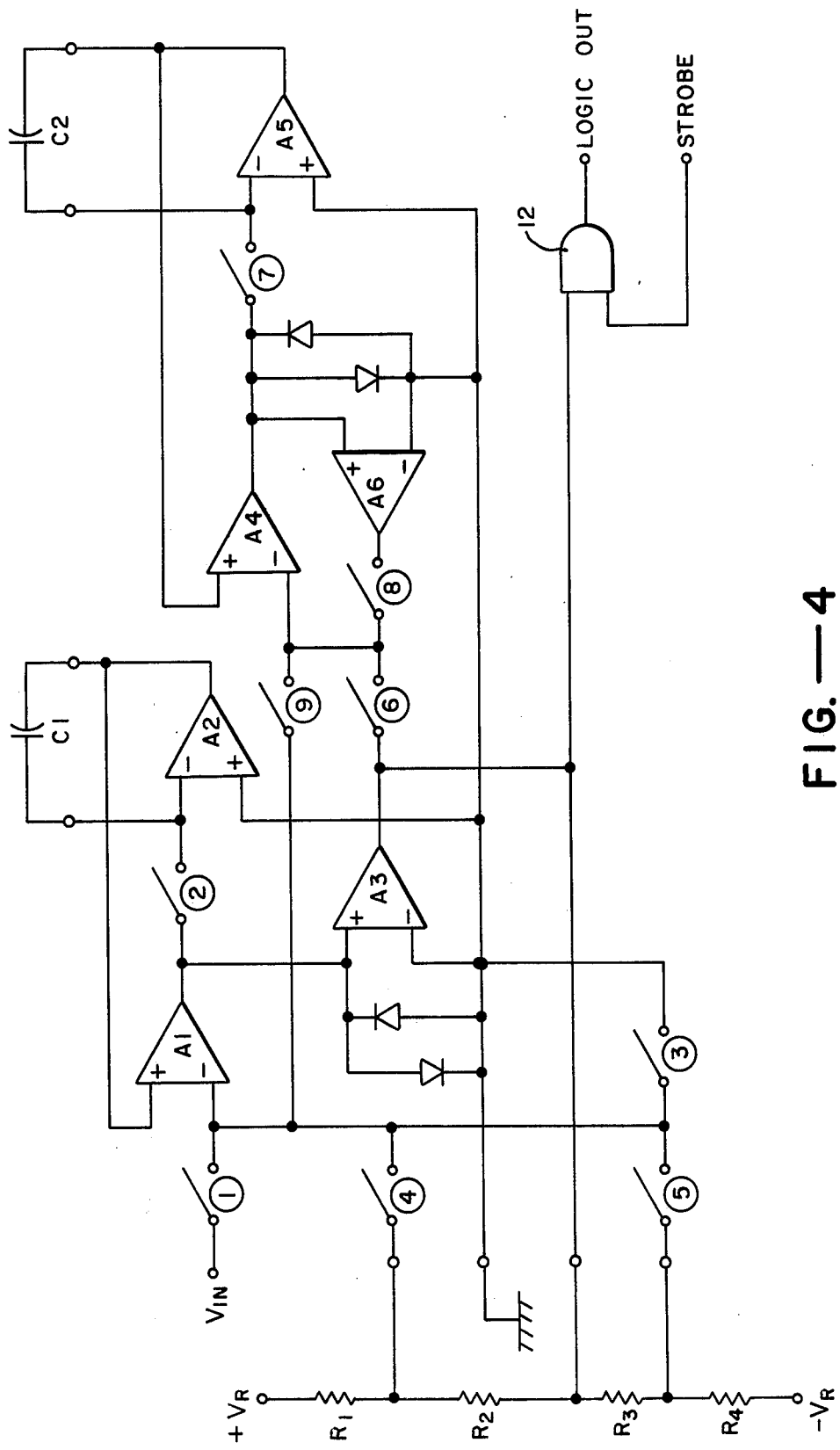
FIG.—4

METHOD AND APPARATUS FOR SAMPLING AND HOLDING AN ANALOG INPUT VOLTAGE WHICH ELIMINATES OFFSET VOLTAGE ERROR

BACKGROUND OF THE INVENTION

The present invention is directed to a method and apparatus for sampling and holding an analog input voltage which eliminates offset voltage error and more specifically to such a circuit which is especially useful in a 12 bit recirculating Gray code analog to digital converter.

An analog to digital converter typically includes, especially when it is of the monolithic type, an R-2R resistive ladder network which requires laser trimming. When a 12 bit converter is required there are serious problems with temperature coefficients and lack of automatic zeroing. Where a recirculating converter incorporating a sample and hold circuit is used, the foregoing problem is eliminated. However, problems of offset voltage and common mode voltage errors are then introduced. Manufacturers have attacked this problem by use of transformers which while tending to eliminate offset errors introduce accompanying mechanical and electrical problems. In addition, such technique requires a zeroing cycle which adds to the time required for conversion. Other manufacturers have produced converters where the offset adjustment and/or temperature compensation networks were added along with perhaps a zeroing mode of operation.

In a 12 bit converter if, for example, a 2,000 millivolt analog input voltage is being measured, the least significant bit will indicate one-half millivolt and this is thus the required accuracy. Most offset errors begin at 1 to 2 millivolts and increase due to common mode voltages.

OBJECTS AND SUMMARY OF THE INVENTION

It is, therefore, a general object of the present invention to provide an improved sample and hold circuit.

It is another object of the invention to provide a circuit as above which eliminates offset voltage error and common mode errors.

It is another object of the invention to provide a sample and hold circuit which is especially suitable for use in a recirculating type analog to digital converter.

In accordance with the above objects there is provided a method of sampling and holding an analog input voltage utilizing a two amplifier sample and hold circuit. The output of the first amplifier is connected to an input of the second amplifier. The second amplifier forms a Miller integrator and provides a feedback of the stored voltage on the capacitor of the Miller integrator to one input of the first amplifier which is a comparator and which also has the analog input voltage as another input. This other input is compared with the feedback of the stored voltage to produce a correcting output. The method comprises sampling and holding the analog voltage by use of the two amplifier sample and hold circuit. Thereafter the analog input voltage from the input of the first amplifier is disconnected and also the output of the first amplifier from the input of the second amplifier is disconnected. The first amplifier is converted to an amplifier of predetermined gain by connecting the output to the disconnected input such connection also providing a voltage proportional to said stored voltage.

BRIEF DESCRIPTION OF THE DRAWINGS

FIGS. 1A through 1C illustrate different prior art sample and hold circuits;

FIG. 2 is a sample and hold circuit embodying the present invention;

FIG. 2A is a schematic circuit of a modification of FIG. 2;

FIG. 3 is a sample and hold circuit embodying the present invention which is especially useful in a recirculating analog to digital converter of the Gray code type;

FIG. 4 is a detailed circuit schematic of a Gray code type analog to digital converter; and FIG. 5 shows the switching sequence of the switches of FIG. 4 to provide the 12 bit conversion.

DETAILED DESCRIPTION OF THE PREFERRED EMBODIMENT

FIG. 1A shows the most common type of sample and hold circuit where when the switch S is closed the capacitor C charges to the sample voltage. The stored voltage is in error by the amount of the offset voltage.

The circuit of FIG. 1B is another prior art technique where the sample voltage is stored in capacitor C with switches $S_2$ and $S_3$ closed. In addition, the amplifier offset voltage is stored on C. Opening $S_2$ and $S_3$ and closing $S_1$ allows the amplifier to be used as a comparator with the $V_{known}$ voltage and here the compare output has effectively subtracted the offset voltage which was stored on the capacitor. However, although an accurate comparison can be made the circuit does not allow the stored voltage to be used as a voltage source which accurately represents the original sample.

FIG. 1C shows a third prior art technique which is a two stage or two amplifier sample and hold circuit. As in the technique of FIG. 1B an accurate comparison can be made but the stored voltage still contains the offset voltage of amplifier A1 as an error.

More specifically, the circuit of FIG. 1C includes the amplifier A2 which is in essence a Miller integrator with the capacitor C connected between its output and its inverting input. The noninverting input is grounded. The output of amplifier A2 is also connected to the noninverting input of amplifer A1 which compares the voltage being stored on capactor C with switch S closed to the sample voltage which is on the inverting input of amplifier A1. A lack of comparison produces a correcting output which is transferred through closed switch S to produce a final stored voltage in capacitor C equal to the sample voltage plus the offset of amplifier A1.

The circuit of FIG. 2 incorporates the improved technique of the present invention and includes all of the elements of FIG. 1C. However, in addition there is a switch $S_1$ which disconnects the sample voltage from amplifier A1 and an additional feedback loop 11 including the switch $S_2$ between the output of amplifier A1 and its inverting input. This converts amplifier A1 when switch $S_2$ is closed to a unity gain amplifier which provides at its output designated $V_{OUTPUT}$ a voltage exactly equal to the sample voltage without any offset error. The offset error of amplifier A1 is effectively subtracted out. In other words, in the technique of the present invention the sample voltage is initially stored on capacitor C by closure of switches $S_1$ and S, $S_2$ being open. Next, $S_1$ and S are opened and $S_2$ closed the stored voltage on capacitor C being inputed to the plus terminal of A1. The offset voltage is subtracted at the minus terminal due to the feedback through $S_2$ from the output of amplifier A1. This feedback connection thus provides an output voltage which is identically equal to the sample voltage. If it is desired to compare the sample voltage with a known voltage, $V_{KNOWN}$ this can be added at the interconnection 11 as shown by the dashed line and switch $S_4$.

Since the switch S would normally be an MOS field effect transistor having a significant capacitance, the opening of switch S causes a pedestal voltage or a step voltage to be stored on capacitor C and thus introduces error. FIG. 2A shows a compensating circuit where instead of grounding the plus terminal of amplifier A2 it is biased with an adjustable pedestal voltage which is selected to compensate for the pedestal added by the switch S. This is connected to the plus terminal of amplifier A2 and thus subtracts from any pedestal voltage added to capacitor C. Switches S and $S_3$ are closed concurrently.

FIG. 3 illustrates a sample and hold circuit similar to FIG. 2 but where the interconnecting circuit 11' connecting the output of amplifier A1 to the inverting input is a resistive bridge $R_1$, $R_2$ where $R_1$ is supplied by a reference voltage $V_{REF}$. Here instead of a unity gain amplifier with switch $S_2$ closed it is an operational amplifier capable of doing the multiplication and subtraction as shown by the equation of FIG. 3; that is, $$V_{OUT} = (V_{STORED})(R_1 + R_2)/R_1 - V_{REF}(R_2)/R_1$$

This equation when $R_1$ is equal to $R_2$, is equivalent to the standard Gray code equation which is $$V_i + 1 = V_R - 2V_i$$

Since in the Gray code $V_i$ is normally an absolute value, the sample and hold circuit of FIG. 3 when used in a Gray code type analog to digital converter must have positive and negative reference voltages which will keep the result within the bounds of $+V_R$ and $-V_R$ and the bit complement must be used whenever the result is obtained through the use of a positive reference voltage.

FIG. 4 illustrates the overall 12 bit converter circuit which incorporates two sample and hold circuits A1, A2 and A4, A5 having respective capacitors C1 and C2. Additional amplifiers A3 and A6 are provided in the associated feedback loops to provide for greater loop gain and therefore increased accuracy; that is especially true for A3. The accompanying switching sequence is shown in FIG. 5. Each time the AND gate 12 is strobed it provides one bit of the total of 12 bits. The circuit of FIG. 4 does not show the pedestal correction of FIG. 2A which would normally be incorporated.

The operation of the circuit is as follows. In state 1 which occurs only on the first bit of the 12 bit sequence the analog input voltage $V_{in}$ is sampled and then stored on the capacitor C1. This includes the offset voltage of A1. C2 and the related circuits are held within normal operating conditions. In state 2 the polarity of the voltage stored on C1 is determined and read out at the logic output. This first bit is normally the sign bit of the 12 bit Gray code. In the A4, A5, C2 portion of the circuit, ground voltage is stored on C2 in order to minimize the voltage excursion during state 3. Either a positive or negative voltage may be stored on C2 during the state 3. Storing ground voltage also keeps related circuits active.

In state 3 the Gray code computation is made as indicated. $V_{in}$ is multiplied by 2 while $V_R$ is being subtracted. Polarity of $V_R$ is selected to keep the result within the bounds of $\pm V_R$. The accuracy is determined by the open loop gain (determined in part by amplifier A3) and the ratio $R_1/R_2$ or $R_4/R_3$. The result of this computation plus the offset voltage is stored on C2.

However, in state 4 the result only is transferred; that is, the result of the foregoing computation as shown in FIG. 5 of $\pm V_R \mp 2V_{IN}$. C1 stores this result plus the offset voltage of A1.

Next state 2 always follows state 4 to determine the polarity of the result and provide the next bit of the Gray code which in this case would be the most significant bit (MSB). Then the process is again continued where in state 3 the typical Gray code equation is calculated. In this calculation the offset voltage in accordance with the invention is subtracted so that the result which is stored in C2 actually does not have the offset voltage and thus there is no cumulative error built up.

Thus with the device of the present invention as illustrated in FIG. 4, each of the sample and hold circuits has an accuracy independent of initial amplifier offset voltage or change in offset voltage due to imperfect common mode rejection. When coupled together the first sample and hold circuit provides the necessary multiplication and subtraction to perform the Gray code computation and the second sample and hold circuit temporarily stores the successive computational results and thus form a highly accurate 12 bit circulating analog to digital converter. By the use of the algebraic capability of the sample and hold circuit of the present invention accurate voltage gains of 2.0 and −1.0 are insured by external resistors which can vary greatly in absolute magnitude but can be easily matched to ratio of 1 to 1 to the same accuracy as desired for the overall system. Because of the foregoing feature and in addition the compensation of offset voltage a zeroing mode of operation is not required.

What is claimed is:

1. A method of sampling and holding an analog input voltage utilizing a two amplifier sample and hold circuit, the output of the first amplifier being connected to an input of the second amplifier, the second amplifier forming a Miller integrator and providing a feedback of the stored voltage on the capacitor of the Miller integrator to one input of the first amplifier which is a comparator and having the analog input voltage as another input which is compared with the feedback of the stored voltage to produce a correcting output, the method comprising the following steps: sampling and holding said analog voltage by use of said two amplifier sample and hold circuit; thereafter disconnecting said analog input voltage from the input of said first amplifier and disconnecting the output of the first amplifier from the input of the second amplifier; and converting said first amplifier to an amplifier of predetermined gain by connecting the output to said disconnected input such connection also providing a voltage proportional to said stored voltage.

2. A method as in claim 1 where said second amplifier includes an inverting input to which said capacitor is connected and the output of said first amplifier and also a non-inverting input and where said disconnection of said first amplifier from the inverting input of the second amplifier produces a pedestal effect said method including the step of biasing said non-inverting input of said second amplifier to compensate for said pedestal.

3. A method as in claim 1 where in said converting step said gain is unity and said voltage at said connection is equal to said stored voltage.

4. Apparatus for sampling and holding an analog input voltage utilzing a two amplifier sample and hold circuit, the output of the first amplifier being connected to an input of the second amplifier, the second amplifier forming a Miller integrator and providing a feedback of the stored voltage on the capacitor of the Miller integrator to one input of the first amplifier which is a comparator and having the analog input voltage as another input which is compared with the feedback of the stored voltage to produce a correcting output, said apparatus comprising means for disconnecting said analog input voltage from the input of said first amplifier and disconnecting the output of the first amplifier from the input of the second amplifier; and means for connecting said output of said first amplifier to its disconnected input.

5. Apparatus as in claim 4 where said means for connecting includes a resistive divider to provide analog multiplication and subtraction.

6. Apparatus as in claim 5 where said analog multiplication and subtraction provides a Gray code function and together with a second said sample and hold circuit for temporarily storing each successive result of the Gray code computation for forming a recirculating analog to digital converter.

7. Apparatus as in claim 4 where said means for connecting forms a feedback loop and includes means for increasing loop gain whereby accuracy is improved.

8. Apparatus as in claim 7 where said means for increasing loop gain includes an amplifier.

* * * * *